(12) United States Patent
Mijuskovic

(10) Patent No.: US 8,401,140 B2
(45) Date of Patent: Mar. 19, 2013

(54) PHASE/FREQUENCY DETECTOR FOR A PHASE-LOCKED LOOP THAT SAMPLES ON BOTH RISING AND FALLING EDGES OF A REFERENCE SIGNAL

(75) Inventor: Dejan Mijuskovic, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 872 days.

(21) Appl. No.: 12/204,972

(22) Filed: Sep. 5, 2008

(65) Prior Publication Data

US 2010/0061499 A1     Mar. 11, 2010

(51) Int. Cl.
*H03D 3/24*     (2006.01)
(52) U.S. Cl. ........................................................ 375/375
(58) Field of Classification Search .................. 375/375, 375/340, 354, 373; 331/1, 11, 17, 25, 27; 327/12, 43, 156, 159, 231, 552
See application file for complete search history.

(56) References Cited

U.S. PATENT DOCUMENTS

| | | | |
|---|---|---|---|
| 4,959,617 A * | 9/1990 | Martin | 327/12 |
| 5,142,555 A | 8/1992 | Whiteside | |
| 5,506,874 A * | 4/1996 | Izzard et al. | 375/340 |
| 5,789,947 A | 8/1998 | Sato | |
| 6,198,355 B1 | 3/2001 | Lindquist et al. | |
| 6,256,362 B1 | 7/2001 | Goldman | |
| 6,774,732 B1 | 8/2004 | Harnishfeger et al. | |
| 6,959,063 B1 * | 10/2005 | Nilsson et al. | 375/376 |
| 7,102,448 B2 | 9/2006 | Chou et al. | |
| 7,382,163 B2 | 6/2008 | Kuo et al. | |
| 7,646,224 B2 * | 1/2010 | Sundby | 327/156 |
| 2007/0030040 A1 * | 2/2007 | Takai et al. | 327/156 |
| 2008/0136540 A1 * | 6/2008 | Li | 331/1 A |
| 2010/0019799 A1 * | 1/2010 | El-Kik | 327/2 |

* cited by examiner

*Primary Examiner* — Sam K Ahn
*Assistant Examiner* — Shawkat M Ali
(74) *Attorney, Agent, or Firm* — Dan D. Hill

(57) ABSTRACT

A circuit comprises a first phase detector, a second phase detector, and combinational logic. The first phase detector is for detecting a phase difference between a rising edge of a first clock signal and a rising edge of a second clock signal, and for providing a first difference signal indicating the phase difference. The second phase detector is for detecting a phase difference at a time of a falling edge of the first clock signal and a time of a falling edge of the second clock signal, and for providing a second difference signal indicating the phase difference. The combinational logic is coupled to receive the first difference signal and the second difference signal, and for preventing the second difference signal from being provided when the first difference signal is being provided.

15 Claims, 7 Drawing Sheets

PHASE/FREQUENCY DETECTOR FOR A PHASE-LOCKED LOOP THAT SAMPLES ON BOTH RISING AND FALLING EDGES OF A REFERENCE SIGNAL

BACKGROUND

1. Field

This disclosure relates generally to phase/frequency detectors, and more specifically, to a phase/frequency detector for a phase-locked loop (PLL) that samples on both rising and falling edges of a reference signal.

2. Related Art

In a PLL, a phase/frequency detector compares the phase of the reference signal to the phase of a divided voltage controlled oscillator (VCO) signal. The output of the phase detector then drives a charge pump which in turn drives a loop filter followed by a VCO. The VCO produces the VCO signal which is divided by a loop divider to generate the divided VCO signal.

FIG. 1 illustrates, in partial block diagram form and partial logic diagram form, a phase/frequency detector 10 in accordance with the prior art. Phase/frequency detector 10 includes D-type flip flops 12 and 14, a delay element 18, and NAND logic gate 16. The D inputs of flip flops 12 and 14 are tied to a high logic level. One flip flop is clocked by a reference signal FREF, the other flip-flop is clocked by a feedback signal FBACK that is provided by a voltage controlled oscillator (VCO) of a PLL. The Q outputs of flip-flops 12 and 14 are combined by NAND gate 16 and the result of the logic operation is delayed by delay element 18 before being used to reset the flip-flops. The Q output of each flip-flop is used to enable a charge pump. One charge pump provides a positive current to the VCO; the other charge pump provides negative current to the VCO. Charge is added to correct phase mismatch between the reference signal and the feedback signal.

This phase detector circuit is generally adequate for most applications. However, loop bandwidth of the PLL is limited by the reference frequency. Because the PLL is updated at the reference frequency, stability considerations require the loop bandwidth to be much smaller than the reference frequency. Higher PLL bandwidth is desirable because it leads to reduction of noise and static phase offset. This can be achieved if the reference frequency is increased. However, in many systems the reference frequency is fixed and cannot be increased, limiting achievable noise and static phase offset performance.

Therefore, what is needed is a PLL that circumvents the above limitations.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
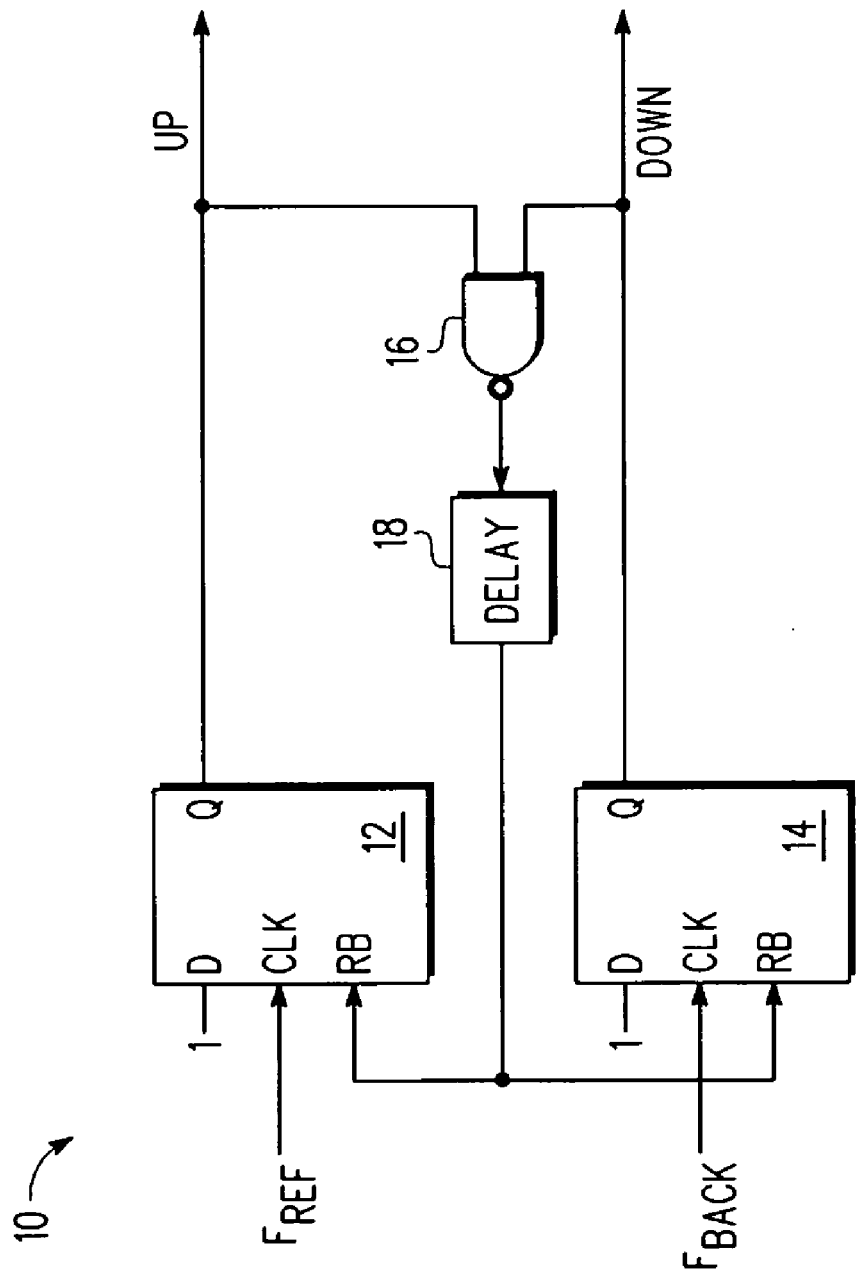
FIG. 1 illustrates, in partial block diagram form and partial logic diagram form, a phase/frequency detector in accordance with the prior art.

Generally, there is provided, a phase/frequency detector for use in a phase-locked loop (PLL). The phase/frequency detector effectively doubles the reference frequency by using both rising and falling edges of the reference clock while also preventing a phase ambiguity that can result in a false lock (180 degree phase ambiguity). In one embodiment, the phase-frequency detector comprises elements of two detectors operating in parallel. One set of flip-flops is triggered on the rising edges of the reference clock, and the other set of flips-flops is triggered at the time of the falling edges. The operation of the two detectors is coordinated by making one detector the "master" and the other detector the "slave". While in phase lock, the two detectors operate independently and are prevented from interacting. This is accomplished by resetting both detectors whenever either detector issues a clear, or reset, signal. That is, a clear signal is issued whenever either UP or DOWN signals from the detector are high, or a logic "1".

In one aspect, there is provided, a circuit comprising a first phase detector, a second phase detector, and combinational logic. The first phase detector is for detecting a phase difference between a rising edge of a first clock signal and a rising edge of a second clock signal, and for providing a first difference signal indicating the phase difference. The second phase detector is for detecting a phase difference at a time of a falling edge of the first clock signal and a time of a falling edge of the second clock signal, and for providing a second difference signal indicating the phase difference. The combinational logic is coupled to receive the first difference signal and the second difference signal, and for preventing the second difference signal from being provided when the first difference signal is being provided. The first phase detector may comprise: a first flip-flop having a first input for receiving the first clock signal, a second input for receiving a clear signal, and an output; a second flip-flop having a first input for receiving the second clock signal, a second input for receiving the clear signal, and an output; and a first logic circuit having a first input coupled to the output of the first flip-flop, a second input coupled to the output of the second flip-flop, and an output. The second phase detector may comprise: a third flip-flop having a first input for receiving an inverted first clock signal, a second input for receiving the clear signal, and an output; a fourth flip-flop having a first input for receiving an inverted second clock signal, a second input for receiving the clear signal, and an output; and a second logic circuit having a first input coupled to the output of the third flip-flop, a second input coupled to the output of the fourth flip-flop, and an output. The combinational logic may comprise: a third logic circuit having a first input coupled to the output of the third flip-flop, a second input coupled to a second output of the second flip-flop, and an output; a fourth logic circuit having a first input coupled to a second output of the first flip-flop, a second input coupled to the output of the fourth flip-flop, and an output; a fifth logic circuit having a first input coupled to the output of the first flip-flop, a second input coupled to the output of the third logic circuit, and an output; and a sixth logic circuit having a first input coupled to the output of the second flip-flop, a second input coupled to the output of the fourth logic circuit, and an output. The circuit may further comprise a seventh logic circuit having a first input coupled to the output of the first logic circuit, a second input coupled to the output of the second logic circuit, and an output coupled to the second inputs of each of the first, second, third, and fourth flip-flops. The circuit may further comprise: a first inverter having an input for receiving the first clock signal, and an output for providing the inverted first clock signal; and a second inverter having an input for receiving the second clock signal, and an output for providing the inverted second clock signal. The circuit may further comprise a delay element coupled between the output of the seventh logic circuit and the second inputs of each of the first, second, third, and fourth flip-flops. The first, second, third, and fourth flip-flops may be characterized as being D-type flip-flops. The circuit may be used as a phase/frequency detector in a phase-locked loop.

In another aspect, there is provided, a circuit comprising: a first flip-flop having a first input for receiving a reference clock signal, a second input for receiving a clear signal, and an output; a second flip-flop having a first input for receiving a feedback signal, a second input for receiving the clear signal, and an output; a third flip-flop having a first input for receiving an inverted reference clock signal, a second input for receiving the clear signal, and an output; a fourth flip-flop having a first input for receiving an inverted feedback signal, a second input for receiving the clear signal, and an output; a first logic circuit having a first input coupled to the output of the first flip-flop, a second input coupled to the output of the third flip-flop, and an output; a second logic circuit having a first input coupled to the output of the second flip-flop, a second input coupled to the output of the fourth flip-flop, and an output; a third logic circuit having a first input coupled to the output of the first flip-flop, a second input coupled to the output of the second flip-flop, and an output; a fourth logic circuit having a first input coupled to the output of the third flip-flop, a second input coupled to the output of the fourth flip-flop, and an output; and a fifth logic circuit having a first input coupled to the output of the third logic circuit, a second input coupled to the output of the fourth logic circuit, and an output coupled to the second inputs of the first, second, third, and fourth flip-flops. The first, second, third, and fourth flip-flops may be characterized as being D-type flip-flops. The first and second logic circuits may each comprise a logic circuit for providing an OR logic function. The third and fourth logic circuits may each comprise a logic circuit for providing a NAND logic function. The fifth logic circuit may comprise a logic circuit for providing an AND logic function. The circuit may further comprise a delay circuit coupled between the output of the fifth logic circuit and the second inputs of the first, second, third, and fourth flip-flops. The circuit may further comprise: a charge pump having a first input coupled to the output of the first logic circuit, a second input coupled to the output of the second logic circuit, and an output; a voltage controlled oscillator having an input coupled to the output of the charge pump, and an output; and a divider having an input coupled to the output of the voltage controlled oscillator, and an output coupled to the first input of the second flip-flop for providing the feedback signal. The circuit may further comprise: a sixth logic circuit coupled between the output of the third flip-flop and the first logic circuit, the sixth logic circuit responsive to both the output of the third flip-flop and the output of the second flip-flop; and a seventh logic circuit coupled between the output of the second logic circuit and the fourth flip-flop, the seventh logic circuit responsive to both the output of the fourth flip-flop and the output of the first flip-flop.

In yet another aspect, there is provided, a phase/frequency detector, comprising: a first flip-flop having a first input for receiving the first clock signal, a second input for receiving a clear signal, and an output; a second flip-flop having a first input for receiving the second clock signal, a second input for receiving the clear signal, and an output; a first logic circuit having a first input coupled to the output of the first flip-flop, a second input coupled to the output of the second flip-flop, and an output; a third flip-flop having a first input for receiving an inverted first clock signal, a second input for receiving the clear signal, and an output; a fourth flip-flop having a first input for receiving an inverted second clock signal, a second input for receiving the clear signal, and an output; a second logic circuit having a first input coupled to the output of the third flip-flop, a second input coupled to the output of the fourth flip-flop, and an output; a third logic circuit having a first input coupled to the output of the third flip-flop, a second input coupled to a second output of the second flip-flop, and an output; a fourth logic circuit having a first input coupled to a second output of the first flip-flop, a second input coupled to the output of the fourth flip-flop, and an output; a fifth logic circuit having a first input coupled to the output of the first flip-flop, a second input coupled to the output of the third logic circuit, and an output; a sixth logic circuit having a first input coupled to the output of the second flip-flop, a second input coupled to the output of the fourth logic circuit, and an output; and a seventh logic circuit having a first input coupled to the output of the first logic circuit, a second input coupled to the output of the second logic circuit, and an output coupled to the second inputs of each of the first, second, third, and fourth flip-flops. The circuit may be used as a phase/frequency detector in a phase-locked loop. The circuit may further comprise a delay element coupled between the output of the seventh logic circuit and the second inputs of each of the first, second, third, and fourth flip-flops.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a letter "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 2:
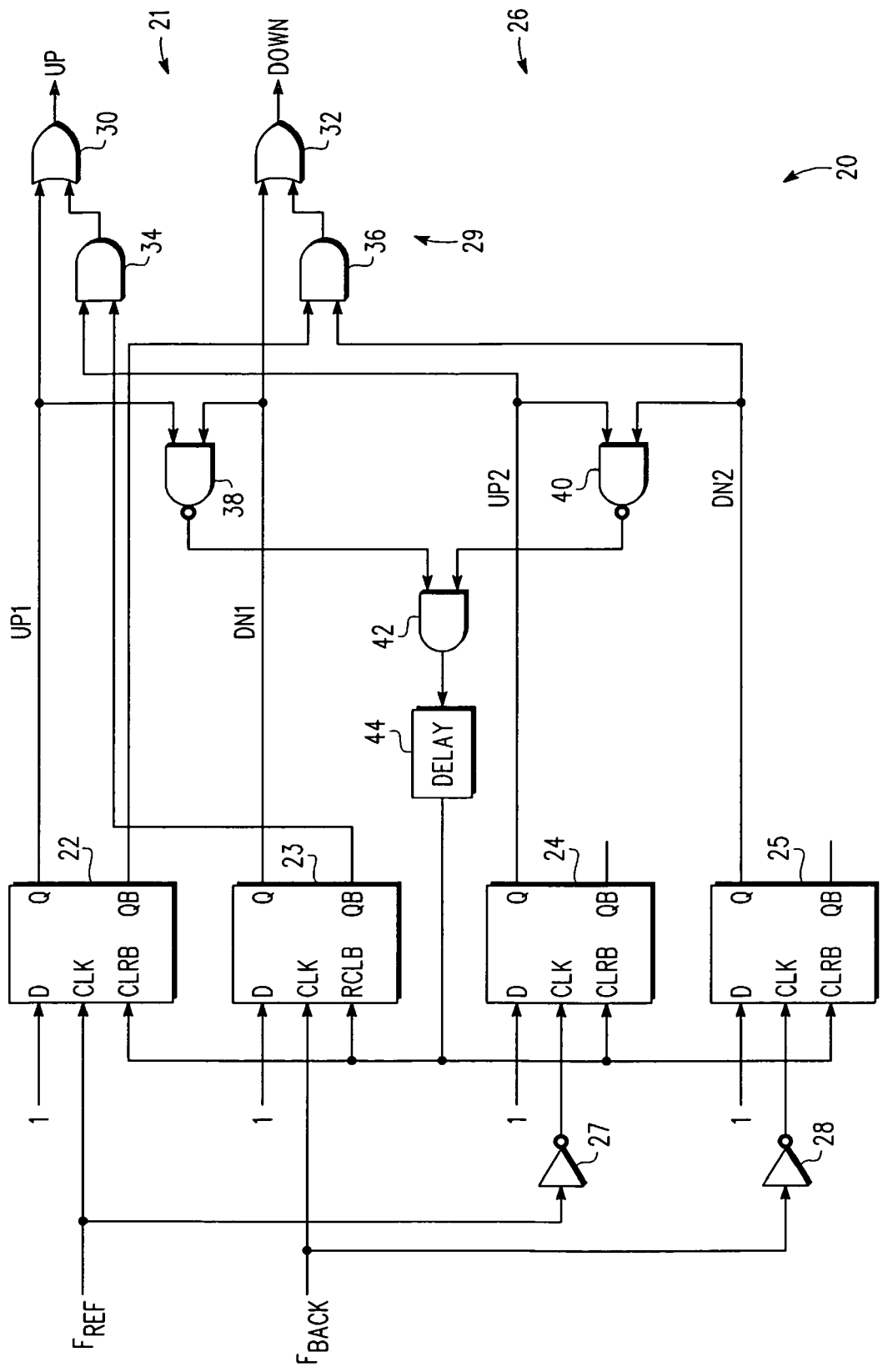
FIG. 2 illustrates, in partial block diagram form and partial logic diagram form, a phase/frequency detector in accordance with an embodiment.

FIG. 2 illustrates, in partial block diagram form and partial logic diagram form, a phase-frequency detector 20 in accordance with an embodiment. Phase-frequency detector 20 includes a first detector 21, a second detector 26, and combinational logic 29. First detector 21 includes flip-flops 22 and 23, and NAND logic gate 38. Second detector includes flip-flops 24 and 25, and NAND logic gate 40. Combinational logic 29 includes OR logic gates 30 and 32, AND logic gates 34, 36, and 42. Some of the logic elements may be shared between the two detectors. For example, in the embodiment of FIG. 2, AND logic 42 and delay element 44 are shared.

In phase-frequency detector 20, each of D-type flip-flops 22-25 has an input terminal labeled "D", a clock input terminal labeled "CLK", a clear, or reset, input terminal labeled "CLRB", and output terminals labeled "Q" and "QB". Each of the D input terminals are coupled to receive a logic "1"

input signal. The CLK input of flip-flop 22 is coupled to receive a reference clock signal labeled "FREF". The CLK input of flip-flop 23 is coupled to receive a feedback clock signal labeled "FBACK". The CLK inputs of flip-flops 24 and 25 are coupled to receive inverted versions of reference clock FREF and feedback clock FBACK, respectively. Output terminals of first phase detector 21 are labeled UP1 and DN1 and are for providing a first difference signal for indicating that there is a phase difference between the signals FREF and FBACK. Likewise, output terminals of second phase detector 26 are UP2 and DN2 and are for providing a second difference signal for indicating that there is a phase difference between the signals FREF and FBACK. Combinational logic 29 receives the first and second difference signals and prevents the second difference signal from being provided if the first difference signal is being provided.

Inverter 27 has an input coupled to receive reference clock signal FREF, and an output coupled to the clock input of flip-flop 24. Inverter 28 has an input coupled to receive feedback clock signal FBACK, and an output coupled to the clock input of flip-flop 25. NAND logic gate 38 has a first input coupled to the Q output of flip-flop 22 for receiving an output signal labeled "UP1", a second input coupled to the Q output of flip-flop 23 for receiving an output signal labeled "DN1", and an output. NAND logic gate 40 has a first input coupled to the Q output of flip-flop 24 for receiving the output signal labeled "UP2", a second input coupled to the Q output of flip-flop 25 for receiving an output signal labeled "DN2", and an output. AND logic gate 42 has a first input coupled to the output of NAND logic gate 38, a second input coupled to the output of NAND logic gate 40, and an output. Delay element 44 has an input coupled to the output of AND logic gate 42, and an output coupled to provide clear signal CLRB to the CLRB inputs of flip-flops 22-25. AND logic gate 34 has a first input coupled to the Q output of flip-flop 24, a second input coupled to the QB output of flip-flip 23, and an output. AND logic gate 36 has a first input coupled to the QB output of flip-flip 22, a second input coupled to the Q output of flip-flip 25, and an output. OR logic gate 30 has a first input coupled to the Q output of flip-flop 22, a second input coupled to the output of AND logic gate 34, and an output for providing a charge pump signal labeled "UP". OR logic gate 32 has a first input coupled to the Q output of flip-flop 23, a second input coupled to the output of AND logic gate 36, and an output for providing a charge pump signal labeled "DOWN".

Figure 3:
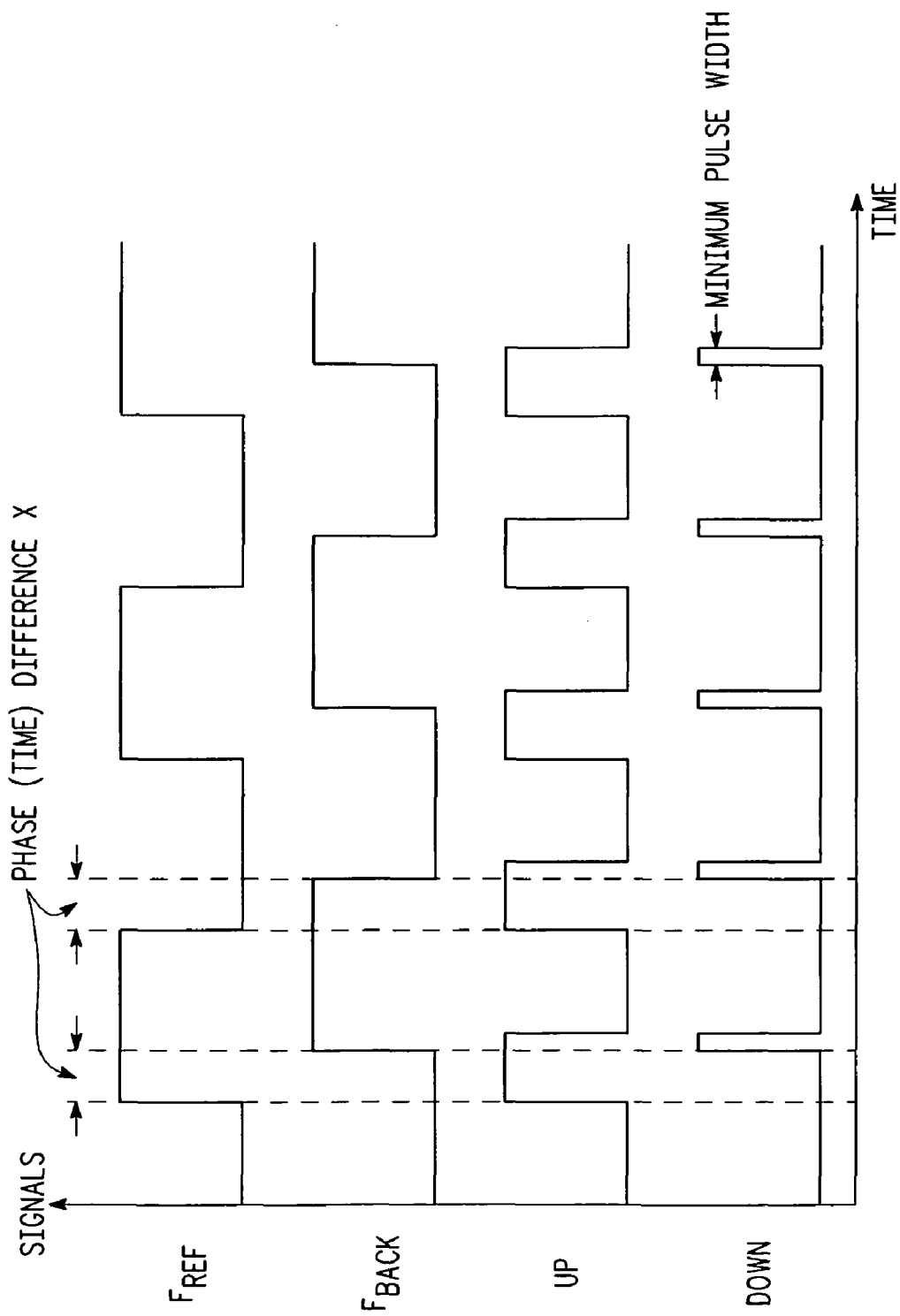
FIG. 3-FIG. 5 illustrate timing diagrams for various signals of the phase/frequency detector of FIG. 2.
Figure 4:
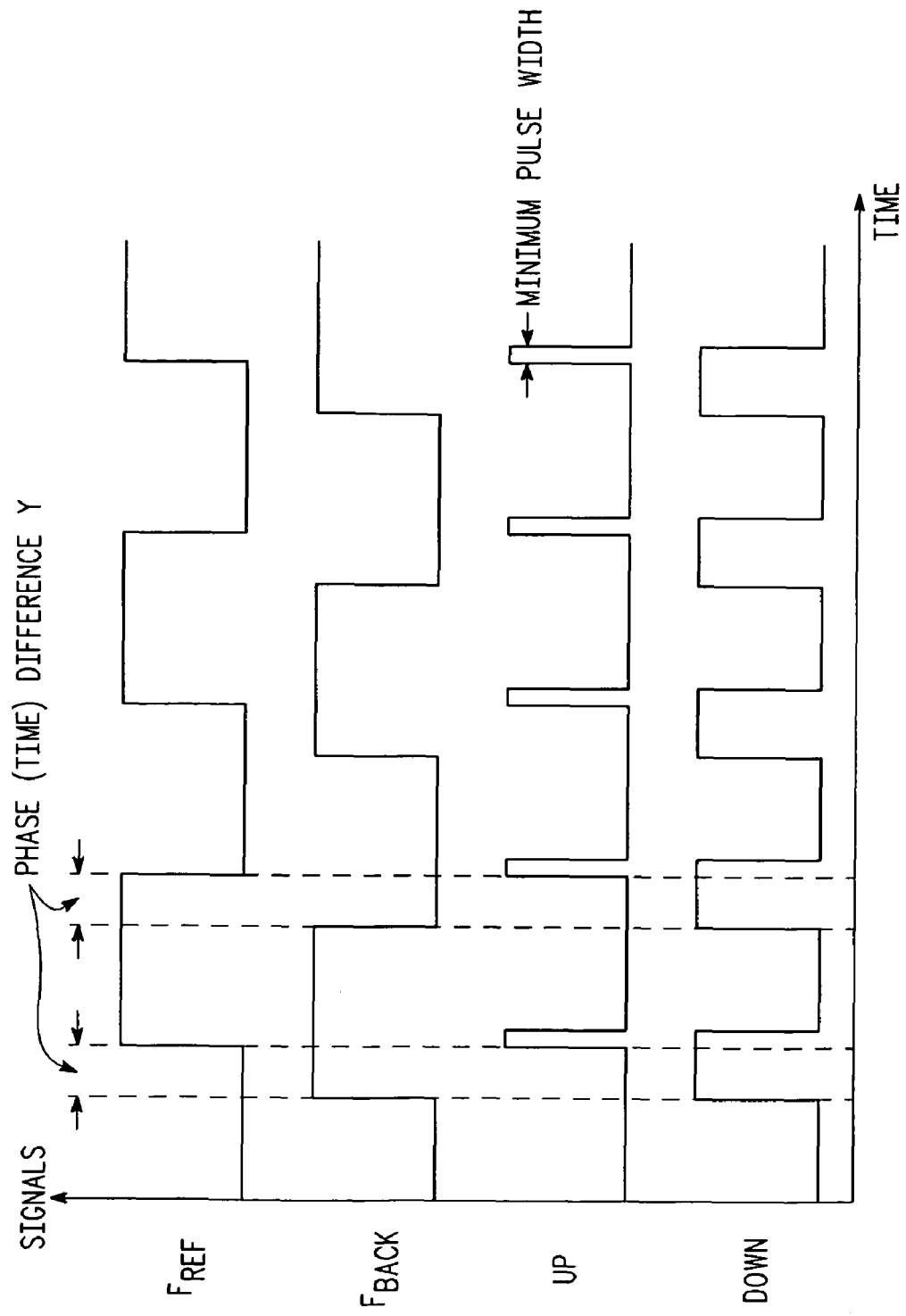
Figure 5:
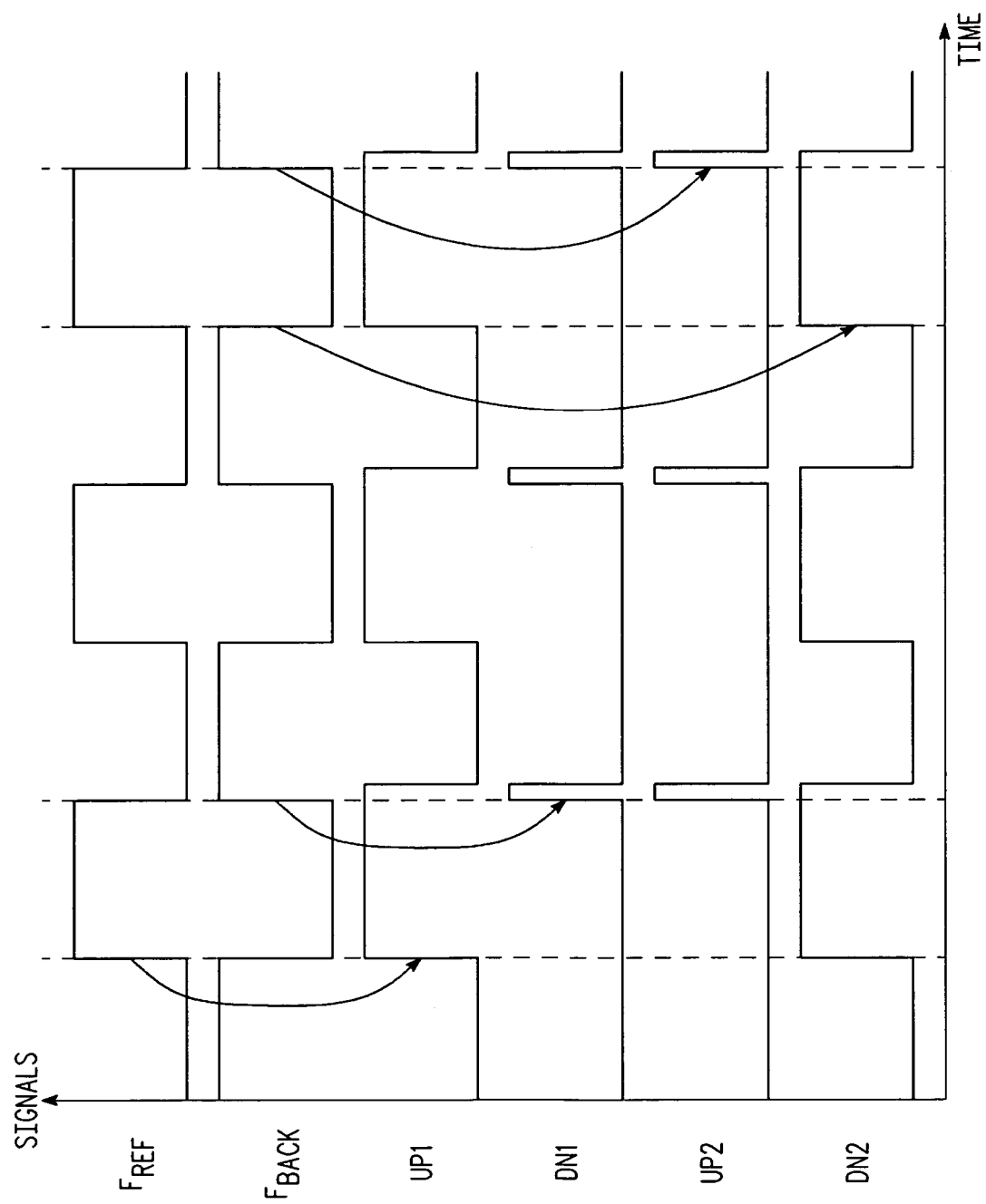

In operation, phase/frequency detector 20 receives reference signal FREF and feedback signal FBACK and provides charge pump signals UP and DOWN in response to detecting a phase difference between FREF and FBACK. First phase detector 21 functions as a positive, or rising, edge phase detector and second phase detector 26 functions as a negative, or falling, edge phase detector. FIG. 3-FIG. 5 illustrate timing diagrams for various signals of the phase/frequency detector of FIG. 2 for different phase relationships of signals FREF and FBACK. For example, FIG. 3 illustrates a case where feedback clock FBACK is trailing reference clock FREF by a phase (time) difference X. Generally, phase/frequency detector 20 responds to both edges of FREF and FBACK. More specifically, first phase detector 21 compares the positive, or rising, edges of FREF and FBACK and issues UP and DOWN charge pump pulses at the outputs as illustrated in FIG. 3. Likewise, second phase detector 26 compares the negative, or falling, edges of FREF and FBACK and issues UP and DOWN charge pump pulses. The rising edge of FREF causes the logic 1 at the D input of flip-flop 22 to be provided at its Q output and thus to OR logic gate 30 to generate the UP pulse. NAND logic gate 38 receives the logic high UP1 pulse and a logic low DN1 pulse and provides a logic high to AND logic gate 42. The rising edge of FBACK causes the logic high, or logic 1, at the D input of flip-flop 23 to be provided at the Q output of flip-flop 23 and to inputs of OR logic gate 32 and NAND logic gate 38. NAND logic gate 38 will then provide a logic high to AND logic gate 42. When both inputs of NAND logic gate 38 are high, a logic low is provided to AND logic gate 42 and an active low clear signal CLRB will be provided to the CLRB inputs of flip-flops 22-25 to clear, or reset, flip-flops 22-25. The pulse width of the UP or DOWN charge pump signals decreases until the reference clock and the feedback clock are synchronized with each other.

Second phase detector 26 functions in the same manner as first phase detector 21 except that inverters 27 and 28 cause flip-flops 24 and 25 to respond at a time corresponding to the falling edges of FREF and FBACK. When either the first or second phase detectors 21 and 26 provides the UP or DOWN pulse, the UP or DOWN pulse will remain high for the phase difference between FREF and FBACK plus the delay from delay element 44. Note that in the case illustrated in FIG. 3, the DOWN pulses have a minimum pulse width and the UP pulses have a pulse width that is equal to the phase difference X plus the minimum pulse width. The minimum pulse width is determined by the delay provided by delay element 44. As can be seen in FIG. 3, the UP pulses thus cause a VCO of a PLL (see FIG. 7) to increase the frequency of FBACK.

FIG. 4 illustrates a case where feedback clock FBACK is leading reference clock FREF by a phase (time) difference Y. As discussed above regarding FIG. 3, phase/frequency detector 20 responds to both edges of FREF and FBACK. More specifically, first phase detector 21 compares the positive, or rising, edges of FREF and FBACK and issues UP and DOWN charge pump pulses at the outputs as illustrated in FIG. 4. Likewise, second phase detector 26 compares the negative, or falling, edges of FREF and FBACK and issues UP and DOWN charge pump pulses. In first phase detector 21, the rising edge of FBACK causes the logic 1 at the D input of flip-flop 23 to be provided at its Q output and thus to OR logic gate 32 to generate the DOWN pulse. NAND logic gate 38 receives the logic high DN1 pulse and a logic low UP1 pulse and provides a logic high to AND logic gate 42. The rising edge of FREF causes the logic high at the D input of flip-flop 22 to be provided at the Q output of flip-flop 22 and to inputs of OR logic gate 30 and NAND logic gate 38. NAND logic gate 38 will then provide a logic high to AND logic gate 42. When both inputs of NAND logic gate 38 are high, a logic low is provided to AND logic gate 42 and an active low clear signal CLRB will be provided to the CLRB inputs of flip-flops 22-25 to clear, or reset, flip-flops 22-25. Second phase detector 26 will function in the same manner as first phase detector 21.

FIG. 5 illustrates a case where a phase difference between reference clock FREF and feedback clock FBACK is 180 degrees. In this case, a 180 degree phase difference means that the rising edge of reference clock FREF occurs substantially at the same time as the falling edge of feedback clock FBACK. In some phase/frequency detectors this phase ambiguity can cause a "false-lock" condition. Also, it is possible that two phase detectors operating together in this situation will command conflicting UP and DOWN signals resulting in a collective zero final output of UP and DOWN pulses and no corrective action from false lock. Phase/frequency detector 20 avoids the problem of conflicting UP and DOWN signals by causing the two phase detectors to operate asymmetrically. That is, in the illustrated embodiment, first phase detector 21 functions as the "master", and second phase detector 26 is the "slave", or subordinate to first phase detector 21. In one embodiment, this is accomplished using functional addition to coordinate lock acquisition. This prevents both phase detectors from issuing conflicting commands to the charge pump. Whenever first phase detector 21 issues, for example, an UP signal, second phase detector 26 is disabled from providing a possible DOWN signal. In the embodiment illustrated in FIG. 2, AND logic gates 34 and 36 are used to "AND" the outputs UP2 and DN2 with the QB outputs of flip-flops 22 and 23. If second phase detector 26 issues a command on the rising edge of FREF, AND logic gates 34 and 36 prevent UP2 and DN2 from affecting signals UP and DOWN.

Still referring to the case illustrated in FIG. 5, first phase detector 21 may determine that feedback clock FBACK is trailing reference clock FREF and issue UP1 pulses. Second phase detector 26 may determine that feedback clock FBACK is leading reference clock FREF and issue DN2 pulses. However, the DN2 pulses are gated by first phase detector 21 and signal UP1 has precedence, causing DN2 to remain at a logic zero. Depending on the initial states of flip-flops 22-25, the opposite condition is possible as well; first phase detector 21 may determine that FBACK is leading FREF and issue DN1 while second phase detector may determine that FBACK is trailing FREF and issue UP2 pulses. The UP2 pulses are gated by first phase detector 21 and DN1 has precedence over the UP2 pulses. The final outputs UP and DOWN are formed as an OR function of UP1 and DN1 while UP2 and DN2 are gated. The non-zero output of the UP and DOWN pulses cause corrective action to be taken and the PLL will be taken out of "false-lock".

Note that some applications may be tolerant of "false-lock" caused by a 180 degree phase ambiguity. In those applications, AND gates 34 and 36 may be removed and the outputs of flip-flops 24 and 25 coupled directly to the second inputs of OR logic gates 30 and 32, respectively. In this embodiment, neither of the first or second phase detectors function as master. Also, note that one skilled in the art will know that the combinational logic illustrated in FIG. 2 is only one example of combinational logic capable of providing the described functionality. Therefore, other embodiments may include different logic gates to accomplish the same or similar functionality.

Figure 6:
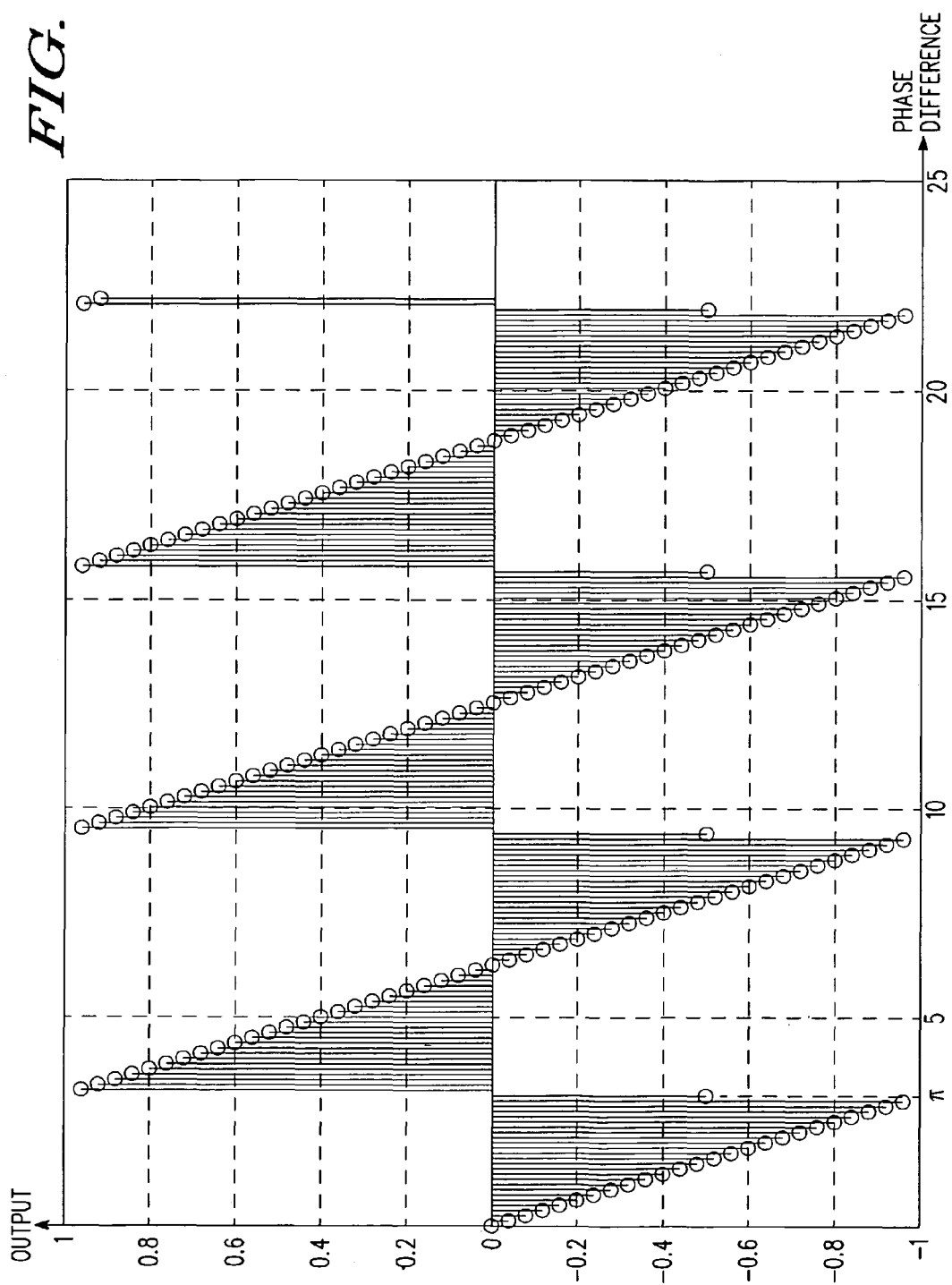
FIG. 6 illustrates a graph of transfer characteristics for the phase/frequency detector of FIG. 2.

FIG. 6 illustrates a graph of transfer characteristics for phase/frequency detector 20 of FIG. 2. The horizontal axis represents the phase difference between reference clock FREF and feedback clock FBACK, and the vertical axis represents a normalized output current. Note that a false-lock cannot occur at $+/-\pi$ because the output at $\pi$ is non-zero.

Figure 7:
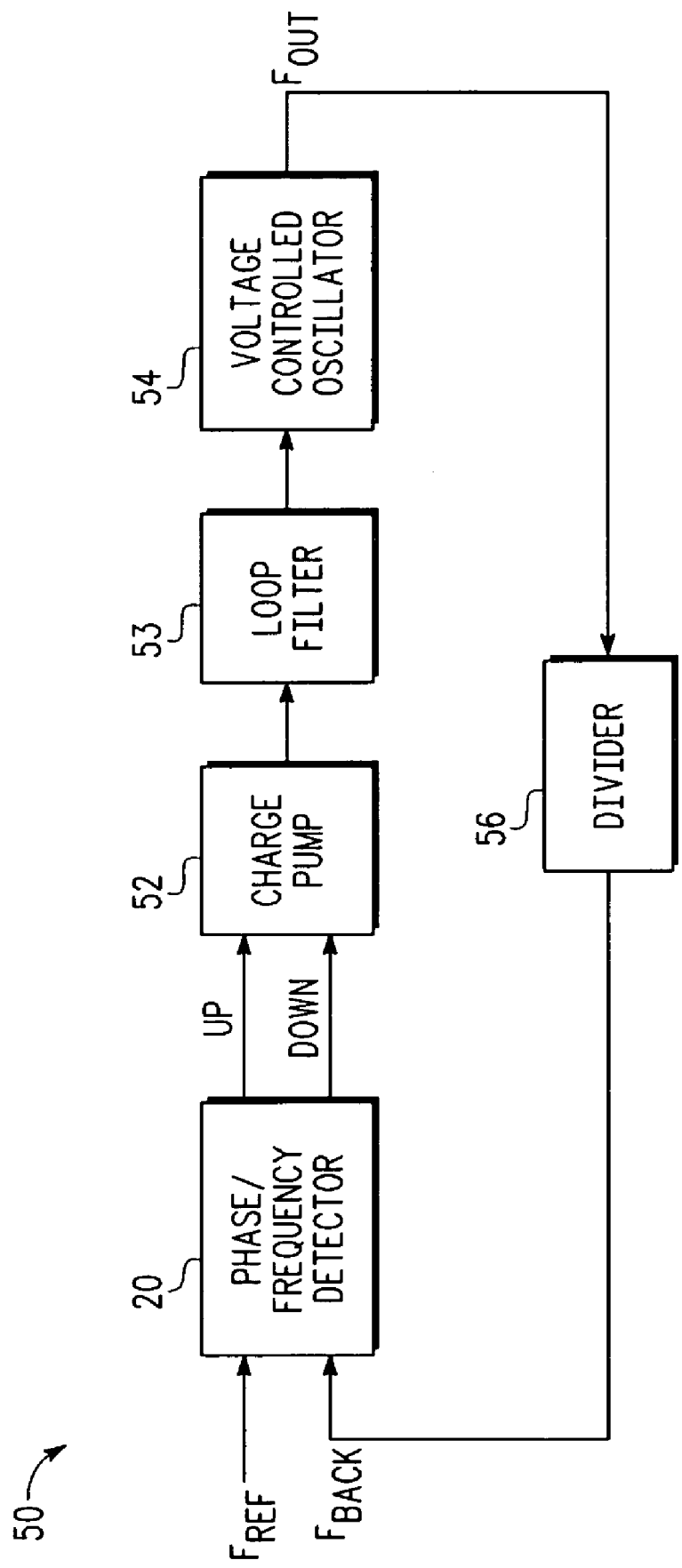
FIG. 7 illustrates, in block diagram form, a phase-locked loop including the phase/frequency detector of FIG. 2.

FIG. 7 illustrates, in block diagram form, one example of a PLL including the phase/frequency detector 20 of FIG. 2. PLL 50 includes phase/frequency detector 20, charge pump 52, loop filter 53, VCO 54, and divider 56. Phase/frequency detector 20 has an input for receiving reference clock FREF. Charge pump 52 has a first input and a second input for receiving signals UP and DOWN from phase/frequency detector 20, respectively, and an output. Loop filter 53 has an input coupled to the output of charge pump 52, and an output. VCO 54 has an input coupled to the output of loop filter 53, and an output for providing output signal FOUT. Divider 56 has an input coupled to the output of VCO 54, and an output for providing feedback clock signal FBACK to phase/frequency detector 20.

PLL 50 functions similarly to a conventional PLL and is "locked" from one frequency to another frequency. Phase/frequency detector 20 receives reference clock FREF and feedback clock FBACK. In response to detecting a phase difference between the two signals, phase/frequency detector 20 issues the UP and DOWN signals, as needed, to cause charge pump 52 to provide adjust the voltage provided to VCO 54. Loop filter 53 smooths the pulses from charge pump 52 to remove noise and potential stability problems before providing the charge pump pulses to VCO 54. Phase/frequency detector 20 operates as described above. The output signal FOUT is provided to divider 56. Divider 56 divides down, or lowers the frequency of FOUT. This allows VCO 54 to operate at a different frequency than the frequency of the reference signal FREF.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Thus, it is to be understood that the logic circuits depicted herein are merely exemplary, and that in fact many other logic circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of phase/frequency detector 20 are circuitry located on a single integrated circuit or within a same device. Alternatively, phase/frequency detector 20 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
    a first phase detector for detecting a first phase difference between a rising edge of a first clock signal and a rising edge of a second clock signal, and for providing a first difference signal indicating the first phase difference, and for issuing a first clear signal when both the rising edge of the first clock signal and the rising edge of the second clock signal have been detected, wherein the first phase detector comprises:
        a first flip-flop having a first input for receiving the first clock signal, a second input for receiving the clear signal, and an output;
        a second flip-flop having a first input for receiving the second clock signal, a second input for receiving the clear signal, and an output; and
        a first logic circuit having a first input coupled to the output of the first flip-flop, a second input coupled to the output of the second flip-flop, and an output;
    a second phase detector for detecting a second phase difference between a time of a falling edge of the first clock signal and a time of a falling edge of the second clock signal, and for providing a second difference signal indicating the second phase difference, and for issuing a second clear signal when both the falling edge of the first clock signal and the falling edge of the second clock signal have been detected, wherein the second phase detector comprises:
        a third flip-flop having a first input for receiving an inverted first clock signal, a second input for receiving the clear signal, and an output;
        a fourth flip-flop having a first input for receiving an inverted second clock signal, a second input for receiving the clear signal, and an output; and
        a second logic circuit having a first input coupled to the output of the third flip-flop, a second input coupled to the output of the fourth flip-flop, and an output; and
    combinational logic coupled to receive the first difference signal and the second difference signal, the combinational logic for preventing the second difference signal from being provided when the first difference signal is being provided by resetting both of the first and second phase detectors whenever either of the first or second phase detectors issues either the first or second clear signal, wherein the combinational logic comprises:
        a third logic circuit having a first input coupled to the output of the third flip-flop, a second input coupled to a second output of the second flip-flop, and an output;
        a fourth logic circuit having a first input coupled to a second output of the first flip-flop, a second input coupled to the output of the fourth flip-flop, and an output;
        a fifth logic circuit having a first input coupled to the output of the first flip-flop, a second input coupled to the output of the third logic circuit, and an output; and
        a sixth logic circuit having a first input coupled to the output of the second flip-flop, a second input coupled to the output of the fourth logic circuit, and an output.

2. The circuit of claim 1, further comprising a seventh logic circuit having a first input coupled to the output of the first logic circuit, a second input coupled to the output of the second logic circuit, and an output coupled to the second inputs of each of the first, second, third, and fourth flip-flops.

3. The circuit of claim 2, further comprising:
    a first inverter having an input for receiving the first clock signal, and an output for providing the inverted first clock signal; and
    a second inverter having an input for receiving the second clock signal, and an output for providing the inverted second clock signal.

4. The circuit of claim 2, further comprising a delay element coupled between the output of the seventh logic circuit and the second inputs of each of the first, second, third, and fourth flip-flops.

5. The circuit of claim 4, wherein the first, second, third, and fourth flip-flops are characterized as being D-type flip-flops.

6. The circuit of claim 5, wherein the circuit is used as a phase/frequency detector in a phase-locked loop.

7. A circuit comprising:
    a first flip-flop having a first input for receiving a reference clock signal, a second input for receiving a clear signal, and an output;
    a second flip-flop having a first input for receiving a feedback signal, a second input for receiving the clear signal, and an output;
    a third flip-flop having a first input for receiving an inverted reference clock signal, a second input for receiving the clear signal, and an output;
    a fourth flip-flop having a first input for receiving an inverted feedback signal, a second input for receiving the clear signal, and an output;
    a first logic circuit having a first input coupled to the output of the first flip-flop, a second input coupled to the output of the third flip-flop, and an output;
    a second logic circuit having a first input coupled to the output of the second flip-flop, a second input coupled to the output of the fourth flip-flop, and an output;
    a third logic circuit having a first input coupled to the output of the first flip-flop, a second input coupled to the output of the second flip-flop, and an output;
    a fourth logic circuit having a first input coupled to the output of the third flip-flop, a second input coupled to the output of the fourth flip-flop, and an output;
    a fifth logic circuit having a first input coupled to the output of the third logic circuit, a second input coupled to the output of the fourth logic circuit, and an output coupled to the second inputs of the first, second, third, and fourth flip-flips;
    a charge pump having a first input coupled to the output of the first logic circuit, a second input coupled to the output of the second logic circuit, and an output;
    a voltage controlled oscillator having an input coupled to the output of the charge pump, and an output; and
    a divider having an input coupled to the output of the voltage controlled oscillator, and an output coupled to the first input of the second flip-flop and to the first input of the fourth flip-flop through an inverter for providing the feedback signal.

8. The circuit of claim 7, wherein the first, second, third, and fourth flip-flops are characterized as being D-type flip-flops.

9. The circuit of claim 7, wherein the first and second logic circuits each comprise a logic circuit for providing an OR logic function.

10. The circuit of claim 7, wherein the third and fourth logic circuits each comprise a logic circuit for providing a NAND logic function.

11. The circuit of claim 7, wherein the fifth logic circuit comprises a logic circuit for providing an AND logic function.

12. The circuit of claim 7, further comprising a delay circuit coupled between the output of the fifth logic circuit and the second inputs of the first, second, third, and fourth flip-flops.

13. The circuit of claim 7 further comprising:
a sixth logic circuit coupled between the output of the third flip-flop and the first logic circuit, the sixth logic circuit responsive to both the output of the third flip-flop and the output of the second flip-flop; and
a seventh logic circuit coupled between the output of the second logic circuit and the fourth flip-flop, the seventh logic circuit responsive to both the output of the fourth flip-flop and the output of the first flip-flop.

14. A phase/frequency detector, comprising:
a first flip-flop having a first input for receiving the first clock signal, a second input for receiving a clear signal, and an output;
a second flip-flop having a first input for receiving the second clock signal, a second input for receiving the clear signal, and an output;
a first logic circuit having a first input coupled to the output of the first flip-flop, a second input coupled to the output of the second flip-flop, and an output;
a third flip-flop having a first input for receiving an inverted first clock signal, a second input for receiving the clear signal, and an output;
a fourth flip-flop having a first input for receiving an inverted second clock signal, a second input for receiving the clear signal, and an output;
a second logic circuit having a first input coupled to the output of the third flip-flop, a second input coupled to the output of the fourth flip-flop, and an output;
a third logic circuit having a first input coupled to the output of the third flip-flop, a second input coupled to a second output of the second flip-flop, and an output;
a fourth logic circuit having a first input coupled to a second output of the first flip-flop, a second input coupled to the output of the fourth flip-flop, and an output;
a fifth logic circuit having a first input coupled to the output of the first flip-flop, a second input coupled to the output of the third logic circuit, and an output;
a sixth logic circuit having a first input coupled to the output of the second flip-flop, a second input coupled to the output of the fourth logic circuit, and an output;
a seventh logic circuit having a first input coupled to the output of the first logic circuit, a second input coupled to the output of the second logic circuit, and an output coupled to the second inputs of each of the first, second, third, and fourth flip-flops; and
a delay element coupled between the output of the seventh logic circuit and the second inputs of each of the first, second, third, and fourth flip-flops.

15. The circuit of claim 14, wherein the circuit is used as a phase/frequency detector in a phase-locked loop.

* * * * *